(12) United States Patent
Rechav et al.

(10) Patent No.: US 6,932,873 B2
(45) Date of Patent: Aug. 23, 2005

(54) MANAGING WORK-PIECE DEFLECTION

(75) Inventors: Betsalel Tzvi Rechav, Kiryat-Tivon (IL); Jimmy Vishnipolsky, Petah Tikva (IL); Efim Vinnitsky, Ashkelon (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 10/209,284

(22) Filed: Jul. 30, 2002

(65) Prior Publication Data

US 2004/0020438 A1 Feb. 5, 2004

(51) Int. Cl.[7] .......................... H01L 21/20; C23C 16/00
(52) U.S. Cl. ................. 118/733; 118/728; 118/725; 118/724; 118/729; 156/345.51; 156/345.52; 156/345.53; 156/345.54; 384/134; 277/345
(58) Field of Search ................. 118/715–733; 156/345.51, 345.52, 345.53, 345.54; 384/134; 277/345

(56) References Cited

U.S. PATENT DOCUMENTS 5,105,762 A * 4/1992 Wilkinson ................... 118/733
5,997,963 A * 12/1999 Davison et al. ............. 427/582
6,603,130 B1 * 8/2003 Bisschops et al. ........ 250/492.1
2003/0134574 A1 * 7/2003 Uziel ........................... 451/39

FOREIGN PATENT DOCUMENTS

JP          02212624 A  * 8/1990  ........... F16C/32/06
JP        2000067793 A  * 3/2000  ............ H01J/37/20

* cited by examiner

Primary Examiner—Gregory Mills
Assistant Examiner—Ram N Kackar
(74) Attorney, Agent, or Firm—Blakely, Sokoloff, Taylor & Zafman (57) ABSTRACT

A work-piece deflection management system including: (a) a first and a second vacuum chambers, each said vacuum chamber having an air-bearing seal circumscribing one of its sides, and (b) a work-piece plate; wherein the air-bearing seals are aligned to face one-another with the work-piece plate respectively there-between, allowing the work-piece to be laterally slid with respect to the air-bearing seals while maintaining a first predefined vacuum level within the first vacuum chamber and maintaining a second predefined vacuum level within the second vacuum chamber.

37 Claims, 6 Drawing Sheets

MANAGING WORK-PIECE DEFLECTION

FIELD OF THE INVENTION

The present invention generally relates to a system for improving work-piece stability characteristics in the vicinity of an air-bearing seal enabled vacuum chamber. The present invention specifically relates to using compensatory forces to manage work-piece stability characteristics, such as flatness.

BACKGROUND OF THE INVENTION

Many of today's high precision fabrication process are conducted in vacuum chambers. These processes include vacuum deposition of material, optical and electronic lithography mask pattern transference in semiconductor layer formation by selective removal of materials, Micro-Electro-Mechanical Systems (MEMs), Lab-on-a-Chip (LOC) Devices, Nano-Electro-Mechanical Systems (NEMS), micro scale controlled growth of materials, and the likes. Working in a vacuum environment is complicated by relatively nonexistent heat transfer rates through vacuum, by the high volatility of many otherwise stable substances in vacuum, and by similar thermodynamic extreme cases that arise in vacuum. These problems may be circumvented for applications requiring introducing mechanical motion into an appendage of the vacuum chamber by using complex systems of transfer rods inside flexible bellows, which link a source of mechanical power located outside the chamber with a work-piece manipulation requirement located in the chamber. Such an arrangement is described as a prior art in U.S. Pat. No. 5,784,925 (FIG. 1). In this prior art heat generation and vacuum contamination risks are reduced considerably, since the motors that produce the power for the motion are outside the vacuum chamber. However, the transfer rods and the flexible bellows pose a practical limitation on the rigidity of the system, and hence its accuracy and resistance to vibrations, and on the extent of the motion of the work piece that it enables.

U.S. Pat. No. 5,784,925 teaches yet another solution for providing accurate linear motion inside a vacuum chamber. In U.S. Pat. No. 5,784,925 a fluid bearing is incorporated inside a vacuum chamber characterized by a first pressure, and a fluid disposal system maintains a region with a second pressure level, higher than the first pressure but substantially lower than one atmosphere. Motors inside the vacuum chamber provide the motion to collars that slide on rods through the said air bearings and carry the work piece.

Albeit the advantages in providing accurate motion of a work piece inside a vacuum chamber, substantially within the size of similar systems that operate in atmosphere, U.S. Pat. No. 5,784,925 still suffers a few drawbacks. Sagging of the rods under the payload weight degrade the flatness of the motion. The motors inside the vacuum chamber are a source of heat, contamination and electromagnetic fields, all being a threat to the process taking place inside the vacuum chamber, or adding complexity to the system design. Also, flexible pipes that carry the fluid to the fluid bearing inside the vacuum chamber, and then remove it from the bearing outside of the vacuum chamber, must be carried with the moving collars that slide on the rods, thus degrading the smoothness of the motion provided by the system.

Substantially any accurate industrial fabrication processes which take place in vacuum, including all of the aforementioned micro scale processes, share a mutual need for high spatial precision. Particularly, there is an ongoing need to improve the precision of work-piece stage motion, to improve the accuracy of measurement with respect to the location and orientation of any predetermined point on the work-piece, and, in conjunction with the aforesaid, to improve any work-piece deflection variability, which ordinarily complicates precision motion or normalization of precision measurements.

Basic approaches to progressive improvements for these kinds of micro-scale fabrication work-piece based systems have been developed. For example, U.S. Pat. No. 6,126,169 presents numerous configurations for using an air-bearing seal to facilitate work on a work-piece stage. U.S. Pat. No. 6,163,033 teaches the use of an air-bearing seal by which a vacuum chamber can be laterally slid over a polished work-piece without perturbing the quality of the chamber's vacuum.

The U.S. Pat. No. 6,163,033 technology desirably provides that substantially all motors, guides and bearings may be outside of the vacuum chamber, thereby allowing a reduction of the dimensions of the vacuum chamber to, for example, the work-piece size plus the required motion range. Since no heat is generated inside the vacuum chamber by these external motors, there is a resultant increased thermal stability. An additional benefit arises in that distancing motors from the work-piece distances electromagnetic fields sources, which may disturb fabrication processes such as electron beam lithography, charged particle etching, or ion deposition Also, in U.S. Pat. No. 6,163,033 the risk of out-gassing, the complexity of adapting motors to a high vacuum environment, the need for heat sinking, and the need for EMF shielding are selectively avoided. Likewise, fewer wires, gas-carrying pipes or other moving parts are connected to the stage inside the vacuum chamber or associated with it. Thus out-gassing is comparatively minimized.

Nevertheless, substantial motion accuracy is not exactly facilitated in U.S. Pat. No. 6,163,033 since new work-piece deflections are introduced. Embodiments of U.S. Pat. No. 6,163,033 suffer from resultant work-piece deflection variability, and from introduced complications effecting work-piece location precision.

Simply stated, there are two fundamental shortcomings that are inadvertently introduced with embodiments of U.S. Pat. No. 6,163,033. Firstly, deflections of the flatness of the work-piece occur because of stress imposed by the air-bearing seals to selected regions of the work-piece where the air-bearing seals (and the vacuum chamber circumscribed thereby) interface thereto. These deflections are further complicated in that they migrate with the laterally sliding of the vacuum chamber. Secondly, access limitations to the desired fabrication process location of the work-piece are imposed by the considerable structural integrity requirements of the work-piece per se; since the common wisdom solution to work-piece deflections has been to use a polished heavy monolithic slab for the work-piece.

Nevertheless, there is a need in the art for further improvements to these aforementioned embodiments of the U.S. Pat. No. 6,163,033 type systems, or the likes. Basically, it would be a significant improvement in these type systems if the deflection perturbations of the work-piece flatness could be managed in a predetermined way, and preferably reduced. For many applications, it would also be considered an improvement in the art if the stage design could comply with an opening or relatively thin or transparent surface in its central work area, even if aspects of the work-piece deflection problem remained; since such access is presently cumbersome in light of the massive work-pieces currently in use.

While these needs in the art can be simply described, one should remain cognizant to maintaining known work-piece improvements with respect to minimizing out-gassing, distancing sources of EMF, and avoiding introducing of unnecessary heat sources with the vacuum.

SUMMARY OF THE INVENTION

By way of introduction, each of the simplified fundamental embodiments of the present invention provides at least one of the above-mentioned needed improvement over prior art arrangements.

Specifically, a simplified fundamental embodiment of the present invention relates to a work-piece deflection management system including: (a) two vacuum chambers, each said chamber having an air-bearing seal circumscribing one of its sides, and (b) a work-piece plate; wherein the air-bearing seals are aligned to face one-another with the work-piece plate respectively there-between, allowing the work-piece to be laterally slid with respect to the air-bearing seals while maintaining predefined vacuum levels within the vacuum chambers. Simply stated, the work-piece plate is a flat plainer board-like object that is smooth and polished on both of its flat surfaces. The aligned air-bearing seals are separated substantially by the thickness of this work-piece plate. Accordingly, lateral sliding of the central area of the work-piece plate between the air-bearing seals is accomplished without perturbing the integrity of the vacuum levels in the respective vacuum chambers.

These simplified fundamental embodiments of the present invention provide improved positional accuracy. Wherein a single air-bearing scaled vacuum chamber was slid over a smooth polished work-piece in the prior art, according to the present invention, accurate motion of the work-piece is easier to accomplish than is accurate motion of the vacuum chamber. Furthermore, according to a first significant variation of the aforesaid simplified fundamental embodiment of the present invention, the work-piece plate includes at least one holder for rigidly griping said work-piece plate; thereby allowing precise lateral positioning of the work-piece plate.

Another example of an improvement over the prior art, according to simplified fundamental embodiments of the present invention, relates to improved reliability. Again, wherein a single air-bearing sealed vacuum chamber was slid over a smooth polished work-piece in the prior art, and thereby deformed the surface of the work-piece because of the pressure differences vacuum from both sides of the work-piece, according to embodiments of the present invention, the deformation (work-piece surface deflection) is compensated for by the vacuum chamber on the other side of the work-piece.

According to a second significant variation of the aforesaid simplified fundamental embodiment of the present invention, the work-piece plate includes at least two holders for holding the work-piece plate respectively from at least two substantially opposite edges of said work-piece plate; thereby reducing vibration in the work-piece plate. A further improvement over the prior art is realized with reduced motion derived vibration, because embodiments of the present invention do not encounter the perturbations caused when the work-piece deformation migrates with the motion of its causal vacuum chamber. Accordingly, heretofore-problematic vibration effects are substantially mitigated, or at least better managed.

According to a third significant variation of the aforesaid simplified fundamental embodiment of the present invention, at least one of the air-bearing seals has an overall vacuum chamber circumscribing length of less than about a meter; so that an object located on the work-piece plate may be positioned proximate to a tool material-processing operation within in said chamber or to a tool material-inspection operation, and the operation within said chamber. This particular variation relates to embodiments of the present invention being realized within smaller spatial dimensions that has heretofore been economically feasible.

According to a fourth significant variation of the aforesaid simplified fundamental embodiment of the present invention, vacuum levels in respective vacuum chambers are managed according to a schedule selected from the list: similar vacuum levels; different respective vacuum levels; different vacuums levels albeit wherein resultant forces created thereby are respectively negligible. Particularly, high vacuum level in one vacuum chamber and low vacuum level in the other vacuum chamber substantially null the deflections of the work-piece, due to the negligible forces applied to the work-piece by the residue gas pressure in both vacuum chambers.

According to a fifth significant variation of the aforesaid simplified fundamental embodiment of the present invention, the work-piece plate has at least one opening, and the opening allows pressure equalization between the two vacuum chambers. Simply stated, this variation provides material transfer from one vacuum chamber, on one side of the work-pieces, to the other vacuum chamber, on the other side of the work-piece.

According to a sixth significant variation of the aforesaid simplified fundamental embodiment of the present invention, the work-piece plate includes a thin material body section located in at least one location between the aligned vacuum chambers and not located near or between the regions capable of interfacing with an air-bearing seal. Furthermore, according to a particularly important aspect of this variation, the thin material body section is transparent in a predetermined frequency, facilitating imaging or inspection there-through.

Furthermore, the present invention generally relates to a broad fundamental class of embodiments of a surface deflection management system wherein the aforementioned needs for improvement are iteratively introduced into separate embodiments. These broad fundamental embodiments of the surface deflection class management system of the present invention relate to a use of compensatory forces; caused by vacuum levels in respective vacuum chambers. The system, according to the present invention, includes: a work-piece, a first vacuum chamber, a second vacuum chamber, and an alignment means.

It should be noted at the outset that the abovementioned simplified fundamental embodiment is a particular case of the broad fundamental class of embodiments described immediately hereinafter. Likewise, the six significant variations described above represent particular cases that may also be applied to the broad fundamental embodiments.

The work-piece has a first-side, a body, and a second-side. On the first-side is a closed contiguous region capable of interfacing with an air-bearing seal. On the second-side is a closed contiguous region capable of interfacing with an air-bearing seal. Furthermore, near and between these respective regions, the body of the work-piece has rigid structural integrity.

The first vacuum chamber has an air-bearing seal circumscribing one of its sides. The first vacuum chamber air-bearing seal is positioned on the first-side closed contiguous region of the work-piece, allowing the work-piece to be laterally slid with respect to the first vacuum chamber.

The second vacuum chamber has an air-bearing seal circumscribing one of its sides. The second vacuum chamber air-bearing seal is positioned on the second-side closed contiguous region of the work-piece, allowing the work-piece to be laterally slid with respect to the second vacuum chamber.

The alignment means is for maintaining the first vacuum chamber in substantially alignment with the second vacuum chamber. The alignment means may be circumstantially passive, as is normally the case where the lateral motion of either of the vacuum chambers is a controlled motion or a restricted motion; such as by placing motion stopping posts or rails or the likes. The alignment means may independently be active, as is the case where perturbations of the alignment are either proactively damped or intentionally introduced as a high precision corollary to the lateral motion of the vacuum chamber.

In the context of the present invention, an "air-bearing seal" relates to a multi-segmented surface conformal interface between a vacuum chamber and a surface. The air-bearing seal has in a vacuum chamber distant segment high pressure (namely, higher than one atmosphere), and in a more vacuum chamber proximate segment a continuous circumscribing having a low pressure (namely, significantly lower than one atmosphere) that is substantially sufficient to maintain the integrity of the vacuum in the vacuum chamber—even to the extent that the high pressure segment is leaking into the low pressure segment. Note: a general appreciation of air-bearing seals may be the background section of U.S. Pat. No. 6,126,169, which is herein incorporated by reference as substantially compliant with the aforesaid definition.

There are also substantially equivalent embodiments wherein the air-bearing seals are in the work-piece and the vacuum chambers have flat smooth polished circumscribings. This is to say that there are two logically symmetric ways to understand the abode description (the broad fundamental class of embodiments)—firstly according to its simple reading and secondly according to an example having exact functional equivalence. This is essentially the same type of symmetry of functional equivalence generally exhibited when a plug and a socket are interchanged, the result remains operable, even if particular features become nominally restricted. Here—however—there are more than two variations—so essentially it should be appreciated that there are countless variants of embodiments of the present invention wherein an air-bearing seal and the surface juxtaposed to it are interchanged. For example, in the U.S. Pat. No. 6,163,033 patent one could have described an air-bearing seal floating over a smooth plate or a smooth plate floating over an air-bearing seal.

In addition to the basic aspects and variations of the broad fundamental embodiments of the present invention, other especially useful embodiment configurations will be introduced, including: specific orientation embodiments, aligned chambers embodiments, and vacuum level variation embodiments. After focusing on these especially useful embodiment configurations, numerous other heretofore-unanticipated features of embodiments will be presented. Nevertheless, it should also be appreciated that the present invention relates aspects of numerous combinatorial parametric architectures for the work-piece with respect to the air-bearing seals and the respective vacuum chamber levels; among which a first particularly important embodiment relates to a high precision architecture arrangement wherein the air-bearing seals are all of the same shapes/sizes and the surface distortions the work-piece sides are managed to be minimized. The second of these particularly important embodiment relates to a plate-like work-piece with an opening there-through; enabling physical transfer between the vacuum chambers—to the extent that the respective vacuum chambers may be considered to form a single continuous vacuum system, at least with respect to first order approximations for vacuum levels in the respective chambers.

Firstly among the especially useful embodiment configurations, the present invention also relates to specific orientation embodiments of a surface deflection management system, using compensatory forces, and the system includes: a rigid planar work-piece that is polished on both its upper side and its lower side, and the sides are parallel to each other, and the work-piece has a predetermined spatial orientation; oriented with respect to the work-piece, a first vacuum chamber having an air-bearing seal circumscribing its' lower side, and the first vacuum chamber air-bearing seal is positioned on the upper side of the work-piece allowing the work-piece to be laterally slid with respect to the first vacuum chamber; oriented with respect to the work-piece, a second vacuum chamber having an air-bearing seal circumscribing its upper side, and the second vacuum chamber air-bearing seal is positioned on the lower side of the work-piece allowing the work-piece to be laterally slid with respect to the second vacuum chamber; and oriented with respect to the work-piece, alignment means for maintaining the first vacuum chamber in substantially alignment with the second vacuum chamber. According to one fundamentally useful variation of this aforementioned specific orientation embodiment of the work-piece deflection management system, the rigid planar work-piece is oriented substantially horizontally, in that one of the sides faces upward and the other of the sides faces downward. According to another fundamentally useful variation of this aforementioned specific orientation embodiment of the work-piece deflection management system, the rigid planar work-piece polished sides are oriented substantially vertically, in that one of the sides faces frontward and the other of the sides faces backward.

Secondly among the especially useful embodiment configurations, the present invention furthermore generally relates to aligned chambers embodiments of a surface deflection management system including therein modifications and differentials between vacuum levels of the two vacuum chambers. Specifically, these vacuum level variation embodiments of a surface deflection management system, using compensatory forces, relate to a system that includes: a work-piece, having a first-side, a body, and a second-side, wherein on the first-side is a closed contiguous region capable of interfacing with an air-bearing seal, on the second-side is a closed contiguous region capable of interfacing with an air-bearing seal, and near and between these respective regions, the body of the work-piece has rigid structural integrity; a first vacuum chamber having an air-bearing seal circumscribing one of its sides, and the first vacuum chamber air-bearing seal is positioned on the first-side closed contiguous region of the work-piece, allowing the work-piece to be laterally slid with respect to the first vacuum chamber; a second vacuum chamber having an air-bearing seal circumscribing one of its sides, and the first vacuum chamber and the second vacuum chamber have substantially identically shaped and sized respective air-bearing seals, and the second vacuum chamber air-bearing seal is positioned on the second-side closed contiguous region of the work-piece, allowing the work-piece to be laterally slid with respect to the second vacuum chamber;

and alignment means for maintaining the first vacuum chamber in substantially alignment with the second vacuum chamber.

Now, the present disclosure will relate to embodiments and variations of the present invention wherein there are intentional disparities or asymmetries between the two vacuum chambers. Recall that the basic object of the present invention relates to improved management of work-piece deflection, wherein the original deflection of the work-piece derived from the presence of under-pressure, or vacuum in a vacuum chamber "floating" on the work-piece surface by virtue of an enabled air-bearing seal. Now the basic improvement to this deflection, according to the plain embodiments of the present invention, occurs from the introduction of a second vacuum chamber on the opposite side of the work-piece introducing a compensatory vacuum thereby, and the second vacuum chamber is likewise enabled with an air-bearing seal—so that the work-piece can be laterally slid there-between. Intentional disparities or asymmetries between the two vacuum chamber result in predetermined improvements; some of which are for economic reasons and some of which are for achieving more exotic effects.

For example, even if the vacuum level of the first chamber is at high vacuum, nevertheless an ordinary industrial pumped vacuum level in the second chamber will already provide an improvement to the work-piece surface deflection, caused by the high vacuum. Likewise, lateral movement of one vacuum chamber with respect to the other vacuum chamber will cause the surface deflection to migrate; and this migration may be used as high precision position improvement for the work-piece. Furthermore, it is not strictly necessary for the air-bearing seal sides of the vacuum chambers to be of the same size or of the same shape or of the same work-piece cross section interface; and these types of disparities may be beneficially employed in conjunction with the specific process or test being performed in vacuum in either of the chambers. Particularly interesting variations of theses kinds will now be presented.

One particularly interesting variation of this embodiment relates to the respective air-bearing seals being aligned askew to each other; thereby compensating for some detected positional alignment anomaly of an object (such as a semiconductor wafer) held on the work-piece within one of the vacuum chambers. The skewed alignment might also be applied to correct for lack of parallelism between the opposite faces of the work-piece, as of compensation for the object being held at a slightly inaccurate angle, or the likes. Another particularly interesting variation of this embodiment relates to the first vacuum chamber being connected to the second vacuum chamber through a common vacuum production system, for substantially maintaining negligible net forces on the work-piece. This is a simple cost saving implementation, allowing a single vacuum production apparatus to be used for both vacuum chambers, even if it is connected so as to provide disparate vacuum levels with respect to the two chambers; as described above.

Another embodiment of the present invention relates to a first vacuum chamber positioned on the first side of a work-piece and a second vacuum chamber positioned on the second side of the work-piece. The two vacuum chambers are substantially aligned with each other and the two vacuum chambers are interconnected either by an opening in the work-piece or by an external connection (such as a connecting pipe). This interconnection ensures that the vacuum levels on both sides of the work-piece remain equal.

However, another embodiment of the present invention relates to the vacuum of the first vacuum chamber unconnected to the vacuum of the second vacuum chamber, and a vacuum level of the first chamber is different from a vacuum level in the second chamber. Again, simply stated, sometimes use of a crude vacuum level in the second chamber is enough to adequately compensate for the work-piece deflection caused by the first vacuum chamber. The difference in vacuum levels is controlled so that any deflection of the work-piece can be maintained at a predetermined value. Alternatively, deflections of the work-piece, caused by gravity, work-piece material inconsistencies or by any other source, can be compensated for by controlling the vacuum differential on opposite sides of the work-piece. However, there may be circumstantial reasons for maintaining disparate vacuum levels that have nothing to do with the deflection aspect of the work-piece; for example, when a production process on one side of the work-piece is preferentially performed at a vacuum level different than a data collection operation being performed on the other side of the work-piece, or the likes.

Now, the present disclosure will relate to embodiments and variations of the present invention wherein there are intentional disparities or asymmetries or other anomalies in the work-piece, per se. Particularly interesting variations of theses kinds will now be presented.

There are many possible shapes of the first and second sides of the work-piece. Each side can be uniquely shaped and either similarly or differently shaped from the other. Shapes are determined appropriate to each specific application and can be curved, spherical, stepped, tetrahedral (prism-like) and planar to mention a few alternatives. In certain of the abovementioned shapes, the work-piece side, in fact, becomes poly-sided, that is, having more than a single working side. A work-piece having more than two sides requires configuration to adapt to air-bearing seals for each side.

An additional embodiment of the present invention relates to the work-piece deflection management system in which the work-piece first-side is planar and the work-piece second-side is planar. The preferred embodiment generally relates to planar sides since problems of sealing between each side and its respective vacuum chamber are much simplified when lateral movement of the vacuum chamber relative to the work-piece is a prerequisite. If such movement is rotational or unidirectional, problems relating to sealing of non-planar surfaces are considerably simplified.

Should a specific application require that the shape of the first and second sides differ from each other or require that the one side is differently inclined relative to the other, movement of the work-piece relative to the vacuum chambers is restricted. However, movement of the vacuum chambers relative to each side is possible. Nevertheless, a further and preferred embodiment of the present invention relates to the first-side of the work-piece being parallel to the second-side of the work-piece. The sides being parallel facilitates movement of the work-piece relative to the vacuum chambers, most especially when the vacuum chambers require to be in a fixed position relative to the work-piece.

The usefulness of flat, planar surfaces to facilitate lateral movement of the working surface in all directions relative to the vacuum chambers is advantageous to many applications, especially where the sides of the working surface are parallel. Nonetheless, there are applications in which rotation of the work-piece about a predetermined axis is expedient. An added embodiment of the present invention relates to one or both of the sides of the work-piece being curved in the region capable of interfacing with an air-bearing seal.

Moreover, variations of this added embodiment of the present invention relate to a curved surface, which is either concave or convex in shape. Curvature of either or both sides of the work-piece can be concave or convex and, for example, spherical or cylindrical. As mentioned above, the suitability of such curvature is determined by the nature of the movement required; and the nature of the air-bearing seal interface between the work-piece surface and the respective vacuum chamber is arranged to be operative; necessitating all contact lines of the air-bearing seal to align and perform in juxtaposition with the work-piece surface—and for the motion of the work-piece to be restricted so as not to allow unwanted violations of this juxtaposition.

Now, the present disclosure will relate to embodiments and variations of the present invention wherein there are intentional disparities or asymmetries or other novelties, the virtue of which may be currently more for use in complex experimental practical physics reaction chambers than for industrial semiconductor fabrication facilities. Nevertheless, there is a general trend in the history of semiconductor fabrication to apply facile techniques that have been developed in the physics laboratory, and for the sake of completeness, the present invention considers such arrangements as being substantially equivalent. Recall, the present invention also generally relates to a single work-piece having a vacuum chamber on each side to reduce deflection of the work-piece; as in the abovementioned simplified fundamental. However, a subsequent embodiment of the present invention relates to a work-piece in which the body of the work-piece is divided into two members, and the two members are enabled with at least one air-bearing seal with respect to each other. A variation of a subsequent embodiment of the present invention relates to two members, which are parallel to the sides. A consequence of this arrangement provides for the entire work-piece, that is, both members to move laterally in all directions relative to the vacuum chambers or for each member to move independently of the other. Similarly, similarly shaped co-axial curved members can be rotated relative to one another and relative to the vacuum chambers for specific applications. Furthermore, there is a specially configured air-bearing seal variant, positioned between the two members, the axis of which is required to be appropriately adjustable relative to the axes of first and the second vacuum chambers to reduce deflection of both members.

The work-piece is generally made to preserve the rigidity and structural stability, free from vibration or any other disturbance, as may occur in the course of the processes or measurements performed in any of the proximate vacuum chambers. Being additionally subjected to a vacuum chamber on both sides of the work-piece reduces the effect of deflection caused by a single vacuum chamber. This being the case, one appreciates that the region of the work-piece between the vacuum chambers is only subjected to nominal net forces resulting from any difference in the respective chamber vacuum levels. This being the case, there are situations (such as imaging, diffraction, etc) that preferably necessitate a relatively thin portion of the work-piece. It is important that this need for a thin portion of the work-piece does not compromise the stability and rigidity of the entire work-piece; nor that it traverse the air-bearing seal which would compromise the integrity of the vacuum in the chambers. There are also applications, which require a work-piece that is not a monolithic stone-like slab but are constructed of multiple structural members having more delicate or thin working areas located therein.

Therefore, another embodiment of the present invention relates to the work-piece including a thin material body section located in at least one location between the upper and lower vacuum chambers and not located near or between the regions capable of interfacing with an air-bearing seal. Moreover a variation of this embodiment of the present invention relates to a thin material body section which is transparent in a predetermined frequency, facilitating imaging or inspection there-through. Imaging or inspection is facilitated using infrared, visible light, ultraviolet, x-ray or microwave techniques, to mention a few.

The present invention, in general, refers to a seal arrangement attached or inserted into a circumference of one side of the vacuum chamber so that the seal makes a sealed contact with the smooth surface of the side of the work-piece. Another embodiment of the present invention relates to the one or more of the circumscribings of the vacuum chamber describing a flat polished area and the work-piece side adjacent thereto having a corresponding contour shaped to form an air-bearing seal when in contact with the flat polished area. This embodiment represents the inverse of the preferred embodiment.

Simply stated, this embodiment relates to engineering an air-bearing seal into the work-piece and allowing the circumscribing of the juxtaposed vacuum chamber to be a conformal polished surfaced for lateral passage with respect to the air-bearing seal; again, albeit so as to maintain the integrality of the vacuum in the chamber using alignment means as necessary. When formally stated in the context of the broad fundamental embodiment of the present invention, the embodiment relates to a work-piece deflection management system including: (a) two vacuum chambers, each said chamber having a predetermined interface circumscribing one of its sides, and (b) a work-piece plate having a predetermined interface circumscribing both of its sides; wherein the predetermined interfaces of the vacuum chambers are aligned to face one-another with the work-piece plate respectively there-between, allowing the work-piece to be laterally slid with respect to the vacuum chambers; and an air-bearing seal resides between each vacuum chamber interface and its respective proximate facing work-piece plate interface.

Another example of such an arrangement applies to a circular vacuum chamber surmounting a work-piece that requires to be rotated relative to the vacuum chamber. A circular groove in the work-piece, corresponding to the flat polished area of the vacuum chamber edge, includes a seal to engage the vacuum chamber polished edge. A further example of this embodiment is an arrangement requiring a fixed lateral movement or a fixed predetermined curved movement of the work-piece relative to the vacuum chamber. In this case, a pair of parallel groove-tracks in the work-piece can be utilized to locate a portion of a sealing arrangement and, simultaneously, to facilitate as tracks a specific movement of the work-piece relative to the vacuum chamber.

Alternative to enabling movement of the work-piece in all lateral directions, the use of a track-grooves provides a means for a fixed movement path. Furthermore, the work-piece having one or both sides of a spherical shape, enables a fixed rotation of the work-piece relative to the vacuum chambers. An additional embodiment of the present invention relates to a work-piece, in which part of one of the circumscribings describes a cross section and the work-piece side adjacent thereto has corresponding contour shaped to fit into the cross section of the air-bearing seal, such that the motion of the work-piece is restricted by fitting together of the cross section with the contour. Variations of additional embodiments of the present invention relates to the work-piece part being straight or being curved. A simple example of which includes a work-piece requiring only motion along a single dimension (e.g. "X") wherein tracks or rails or other motion guides may be incorporated into the work-piece; along its surfaces, edges, etc. Another example of which is the abovementioned work-piece requiring only rotation or spinning about a real or imaginary perpendicular axis thereto.

Simply stated, a work-piece that is contoured with, for example, a convex cylindrical shape can be engaged to a cylindrically concave rectangular circumscribing of a vacuum chamber to provide for a fixed lateral movement of the work-piece relative to the vacuum chamber essentially as a track or guide. The converse, that is, the work-piece being concave and the vacuum chamber circumscribing being convex is also feasible to accomplish a fixed movement track. Furthermore, a work-piece with a convex toroid (doughnut-like) shape, or a portion thereof, provides a track for the curved movement of a similarly but concave vacuum chamber circumscribing.

The shapes utilizable for each of the two air-bearing seal circumscribings includes circumscribings that are for example, circular, square, rectangular, ("horse track"), elliptical, and many other shapes. This includes applications in which the shape and size of each seal circumscribing for each of the two vacuum chambers is substantially different. Nevertheless, a further and preferred embodiment of the present invention relates to the two air-bearing seal circumscribings having substantially the same profile. This embodiment includes two vacuum chambers that are symmetric, that is, having the same circumscribing shape, as well as two chambers having substantially the same asymmetric shapes. In the asymmetric case, generally the shapes are aligned in parallel.

Added embodiments of the present invention relate to the two air-bearing seal circumscribings having substantially the same average radius from their respective normal axes and to the two air-bearing seal circumscribings having substantially a predetermined orientation with respect to asymmetries of their respective contours. Two circumscribings having shape differences, such as a circular and an elliptical shape but substantially of similar size, are aligned essentially in parallel but not specifically point-by-point. Similarly, this applies to a circular and square shape, substantially of a similar size. As mentioned above, the suitability of such curvature (or other shape selections) is determined by the nature of the movement required; and the nature of the air-bearing seal interface between the work-piece surface and the respective vacuum chamber is arranged to be operative; necessitating all contact lines of the air-bearing seal to align and perform in juxtaposition with the work-piece surface—and for the motion of the work-piece to be restricted so as not to allow unwanted violations of this juxtaposition—as necessary.

A further example of such asymmetries relates to two vacuum chambers having elliptical shaped circumscribing seals, not necessarily of identical shape. In accordance with a specific need to prevent deflection of a work-piece, these elliptical shaped circumscribing seals can be co-axial or the axes can be mutually displaced, one from the other. Also, the orientation of the two ellipses can be made to coincide or to be rotated relative to each other.

In a similar manner to the elliptical circumscribing having co-axial or mutually displaced axes, another embodiment of the present invention relates to one of the vacuum chambers being moved laterally with respect to the other vacuum chamber. This movement can be necessitated by a specifically required deflection correction, for example, caused by a non-parallel sided work-piece, that is, a surface of varying thickness.

There is a need to finely adjust the movement of the work-piece relative to the vacuum chamber and to the processing devices necessary to process a work-piece. A subsequent embodiment of the present invention relates to the alignment means having a control means for laterally perturbing the alignment of the axes according at least one control factor selected from the list: a predetermined distance, a predetermined angle, a predetermined orientation or a vibration of a predetermined frequency. In processing a work-piece on a work-piece, it is necessary to very accurately control specific movements of the work-piece, such as direction, distance, change of angle, change of orientation. It is also necessary to control the speed and acceleration of each movement of the work-piece.

However, preferred control means for laterally perturbing the alignment of the axes would require a detailed quantitative model of factors effecting forces on respective sides of the work-piece. For example, how vacuum levels in respective chambers, respective sizes and shapes of air-bearing seals, speeds of work-piece motion, and the likes effect work-piece surface deflections. The man of the art will require an actual embodiment of the present of the present invention in order to restrict a computational manifold model of forces effecting work-piece deflection in the embodiment, and therewith will be better able to manage position (or vibration) parameters of operations performed in either of the vacuum chambers.

BRIEF DESCRIPTION OF THE FIGURES

In order to understand the invention and to see how it may be carried out in practice, embodiments including the preferred embodiment will now be described, by way of non-limiting example only, with reference to the accompanying drawings, in which.

DETAILED DESCRIPTION OF THE PREFERRED EMBODIMENTS

Figure 1:
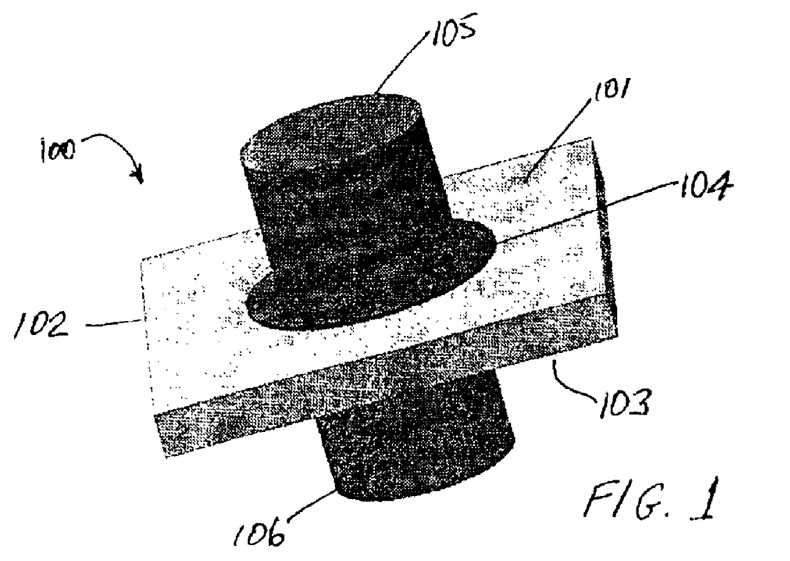
FIG. 1 illustrates an isometric schematic view of a work surface and upper and lower vacuum chambers.
Figure 2:
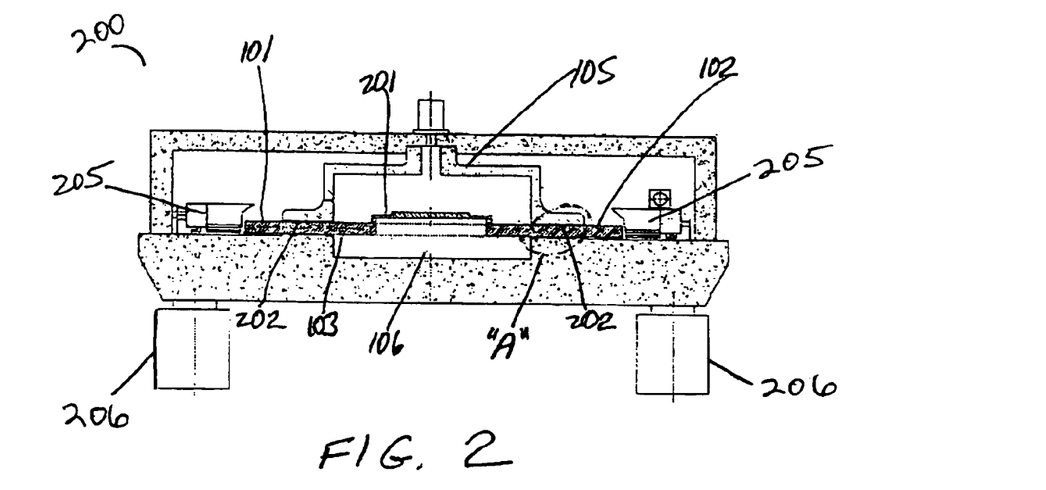
FIG. 2 illustrates a cross-sectional view of a work surface including a work-piece.
Figure 3:
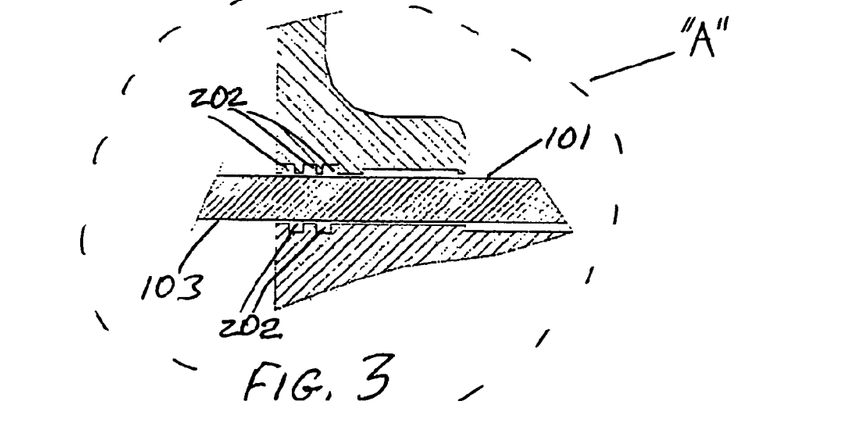
FIG. 3 illustrates a detailed sectional view of an air-bearing seal arrangement "A" as shown in FIG. 2.

Referring to FIGS. 1, 2 and 3—the present invention relates to a work-piece deflection management system, using compensatory forces and the system includes a work-piece 100, having a first-side 101, a body 102, and a second-side 103. On the first-side is a closed contiguous region capable of interfacing with an air-bearing seal 104, and on the second-side is a closed contiguous region capable of interfacing with an air-bearing seal (not shown). Near and between these respective regions, the body of the work-piece has rigid structural integrity. The system also includes a first vacuum chamber 105 having an air-bearing seal 104 circumscribing one of its sides. The first vacuum chamber air-bearing seal is positioned on the first-side closed contiguous region of the work-piece, allowing the work-piece to be laterally slid with respect to the first vacuum chamber. Further there is included a second vacuum chamber 106 having an air-bearing seal circumscribing one of its sides. The second vacuum chamber air-bearing seal is positioned on the second-side closed contiguous region of the work-piece, allowing the work-piece to be laterally slid with respect to the second vacuum chamber. There is alignment means (not shown) for maintaining the first vacuum chamber substantially in alignment with the second vacuum chamber.

In accordance with embodiments of the present invention relating to the work-piece having a first side, a body and a second side, the work-piece first-side is planar, the second-side is planar, and the work-piece first-side is parallel to the second-side.

Figure 4:
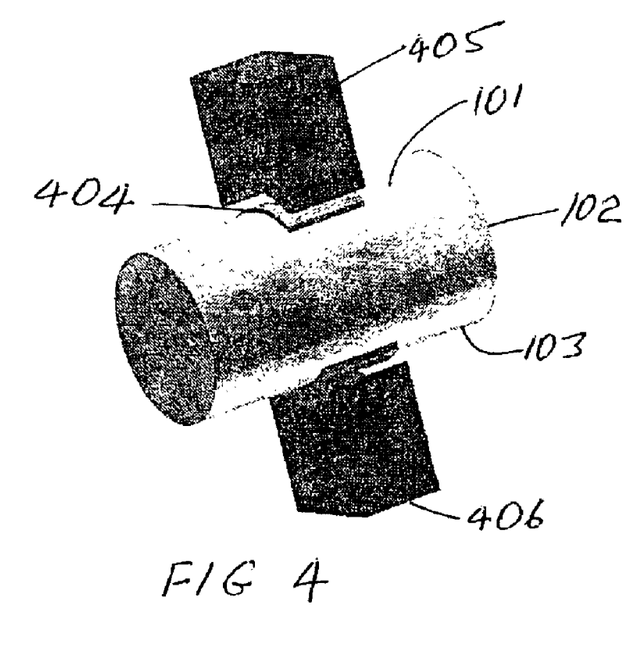
FIG. 4 illustrates an isometric schematic view of a curved, convex working surface and vacuum chambers.
Figure 5:
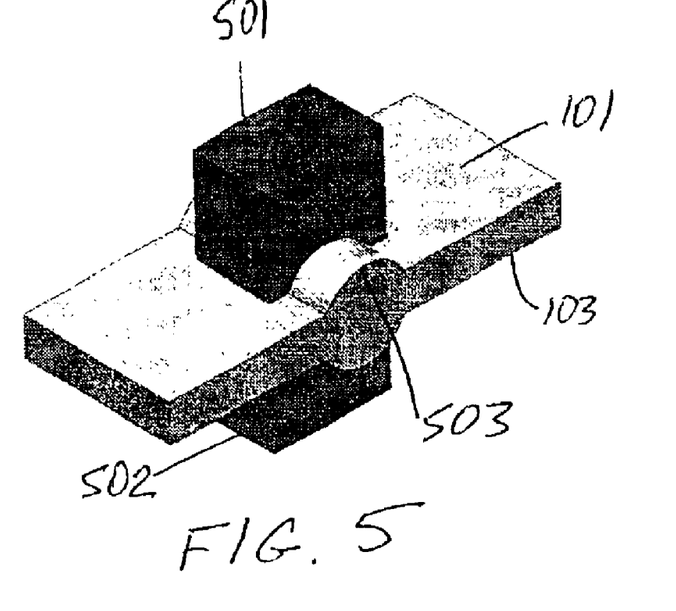
FIG. 5 illustrates an isometric schematic view of a curved, convex section of a planar working surface.
Figure 6:
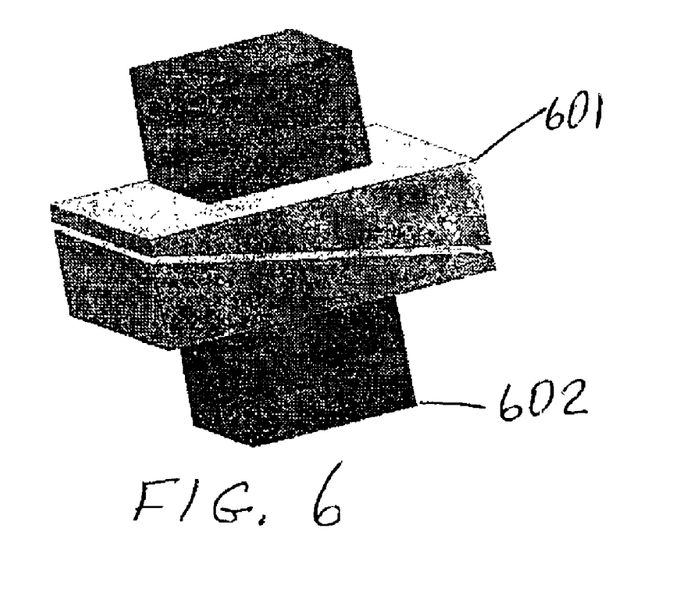
FIG. 6 illustrates an isometric schematic view of a divided work-surface.
Figure 7:
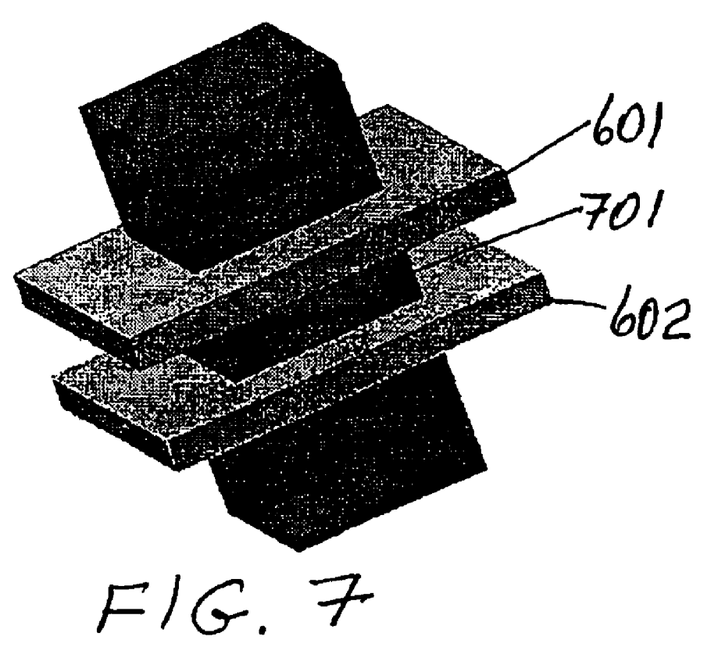
FIG. 7 illustrates an isometric schematic view of a divided work surface having an air-bearing seal with respect to each other.

Further relating to the work-piece having a first side, a body and a second side, and referring now to FIGS. 4 and 5. According to other embodiments of the present invention, one or both of the sides 402 and 403 of the work-piece 401 is curved in the region capable of interfacing with an air-bearing seal. The curved surface is either concave or convex. Referring also to FIGS. 6 and 7, the body of the work-piece is divided into two members 601 and 602. The two members are enabled with one or more air-bearing seals 701 with respect to each other and, further, the members are parallel to the sides.

Turning now to FIGS. 2 and 3, according to additional embodiments of the present invention, the work-piece body includes a thin material body section 201 located in one or more locations between the upper and lower vacuum chambers. The work-piece body is not located near or between the regions capable of interfacing with an air-bearing seal 202. According to another aspect of this embodiment, the thin material body section is transparent in a predetermined frequency, facilitating imaging or inspection there-through.

Chamber assembly 200 includes at least one work-piece holder 205 for rigidly holding and positioning the work-piece 100 within chamber assembly 200. Chamber assembly 200 further includes at least one alignment device 206 for maintaining the first vacuum chamber 105 in substantial alignment with the second vacuum chamber 106.

Turning once again to FIG. 1, according to other embodiments of the present invention, relating to a work-piece 100 having a first side 101, a body 102 and a second side 103. One or both of the sides of the work-piece or the body of the work-piece is made from a thick stone-like material, a lightweight composite material, a ceramic material, a metallic material or from a glass.

Turning now to FIG. 5, in relation to a first 501 or second 502 vacuum chamber, having an air-bearing seal circumscribing one of its sides 101 and 103. According to further embodiments of the present invention, one or more of the circumscribings describe a flat polished area 101 and the work-piece side adjacent thereto has corresponding contour 503 shaped to form an air-bearing seal when in contact with the flat polished area. Alternatively, turning again to FIG. 4, part of one of the circumscribings describes a cross section and the work-piece side 404 adjacent thereto has corresponding contour shaped to fit into the cross section of the air-bearing seal. Consequently, the motion of the work-piece is restricted by fitting together of the cross section with the contour or in which the part is straight or curved. According to another embodiment of the present invention, the two air-bearing seal circumscribings have substantially the same profile.

Furthermore, in accordance with other embodiments of the present invention, relating to a first and a second vacuum chamber having air-bearing seals circumscribing one side of each chamber, the two air-bearing seal circumscribings have substantially the same average radius from their respective normal axes. In addition, the two air-bearing seal circumscribings have substantially a predetermined orientation with respect to asymmetries of their respective contours or with respect to their respective profiles.

Turning again to FIGS. 4 and 5, in accordance with additional embodiments of the present invention relating to air-bearing seals positioned on both the first 101 and second 103 sides respective closed contiguous regions of the work-piece. The respective air-bearing seals 401, 406, 501 and 502 are selected to include one or more of the parameters. According these parameters, the air-bearing seals are similar to each other, the air-bearing seals' circumscribings are circular or are oriented parallel to their respective work-piece sides.

Turning once more to FIG. 1, and according to further embodiments of the present invention relating to the first and second vacuum chambers, the vacuum of the first vacuum chamber is not connected to the vacuum of the second vacuum chamber. Therefore, a vacuum level of the first chamber is different from a vacuum level in the second chamber.

Figure 8:
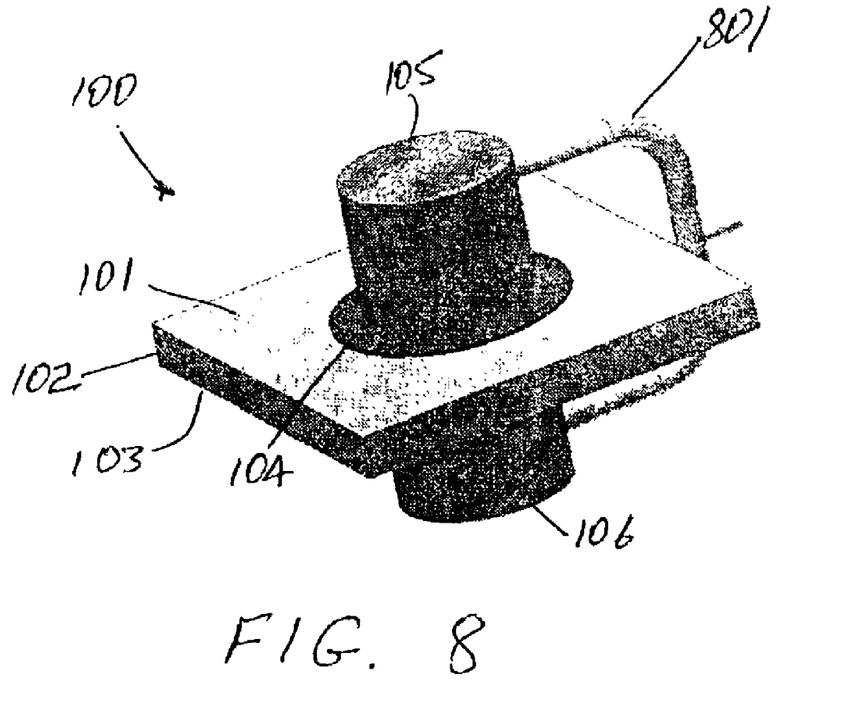
FIG. 8 illustrates an isometric schematic view of a work-surface and upper and lower vacuum chambers including means for adjusting the vacuum relative to one another.
Figure 9:
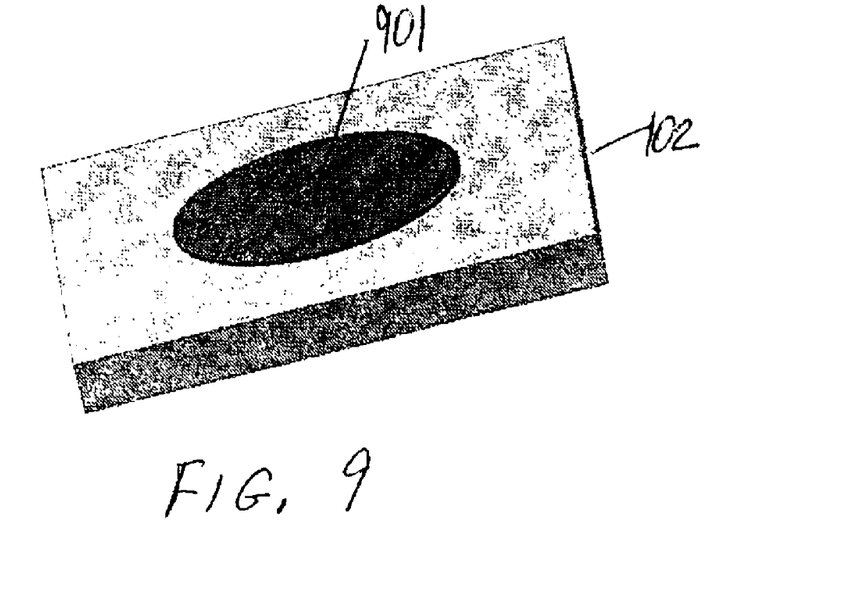
FIG. 9 illustrates an isometric schematic view of a work-surface having a small opening.
Figure 10:
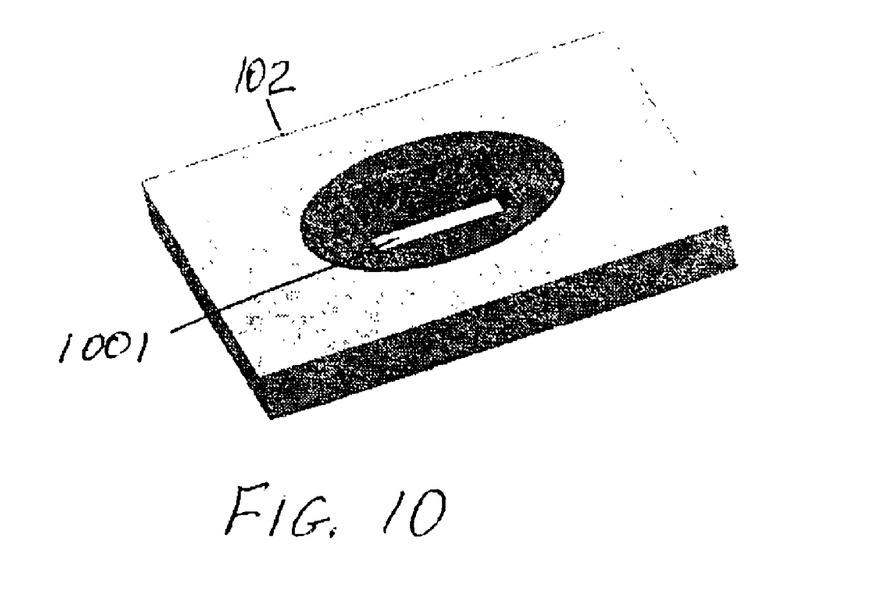
FIG. 10 illustrates an isometric schematic view of a work-surface having a large opening.

Alternatively, turning now to FIGS. 8, 9 and 10, according to further embodiments of the present invention, vacuum levels in respective vacuum chambers are managed such that the vacuum levels in the vacuum chambers are similar, respectively different or are different albeit wherein resultant forces created thereby are respectively negligible.

Relating to alignment means for maintaining the first vacuum chamber substantially in alignment with the second vacuum chamber, according to additional embodiments of the present invention, one of the vacuum chambers can be moved laterally with respect to the other vacuum chamber. Also, the alignment means has a control means for laterally perturbing the alignment of the axes according one or more control factor, namely, a predetermined distance, a predetermined angle, a predetermined orientation or a vibration of a predetermined frequency.

Referring once again to FIG. 1, the present invention also relates to a work-piece deflection management system, using compensatory forces, and the system includes:

a rigid planar work-piece 102 that is polished on both its upper side 101 and its lower side 103, and the sides are parallel to each other, and the work-piece has a predetermined spatial orientation;

oriented with respect to the work-piece, a first vacuum chamber 105 having an air-bearing seal 104 circumscribing its lower side, and the first vacuum chamber air-bearing seal is positioned on the upper side of the work-piece allowing the work-piece to be laterally slid with respect to the first vacuum chamber;

oriented with respect to the work-piece, a second vacuum chamber 106 having an air-bearing seal circumscribing its upper side, and the second vacuum chamber air-bearing seal is positioned on the lower side of the work-piece allowing the work-piece to be laterally slid with respect to the second vacuum chamber; and oriented with respect to the work-piece, alignment means for maintaining the first vacuum chamber in substantially alignment with the second vacuum chamber.

According to additional embodiments of the present invention, the rigid planar work-piece is oriented substantially horizontally, in that, one side faces upward and the other side faces downward. Alternatively, the rigid planar work-piece polished sides are oriented substantially vertically, in that one of the sides faces frontward and the other of the sides faces backward.

Referring, further, to FIG. 1, the present invention, in addition, relates to a work-piece deflection management system, using compensatory forces, and the system includes a work-piece 100, having a first-side 101, a body 102, and a second-side 103. On the first-side is a closed contiguous region capable of interfacing with an air-bearing seal 104, on the second-side is a closed contiguous region capable of interfacing with an air-bearing seal, and near and between these respective regions, the body of the work-piece has rigid structural integrity. Also there is included a first vacuum chamber 105 having an air-bearing seal circumscribing one of its sides. The first vacuum chamber air-bearing seal is positioned on the first-side closed contiguous region of the work-piece, allowing the work-piece to be laterally slid with respect to the first vacuum chamber. In addition, there is a second vacuum chamber 106 having an air-bearing seal circumscribing one of its sides. The first vacuum chamber and the second vacuum chamber have substantially identically shaped and sized respective air-bearing seals. The second vacuum chamber air-bearing seal is positioned on the second-side closed contiguous region of the work-piece, allowing the work-piece to be laterally slid with respect to the second vacuum chamber. Finally, the system includes alignment means for maintaining the first vacuum chamber in substantially alignment with the second vacuum chamber.

Turning once again to FIG. 2, in accordance with other embodiments of the present invention, relating to a work-piece having a first side, a body and a second side, the work-piece body includes a thin material body section 201. The thin material body section is encountered in one or more locations between the upper and lower vacuum chambers. The work-piece body is not located near or between the regions capable of interfacing with an air-bearing seal. According to another aspect of this embodiment, the thin material body section is transparent in a predetermined frequency, facilitating imaging or inspection there-through.

According to an additional embodiment of the present invention, this relates to a first and a second chamber, each having an air-bearing seal circumscribing one of its sides. The respective air-bearing seals are selected to include one or more parameters. These parameters relate to the air-bearing seals being similar to each other; their circumscribings being circular and are oriented parallel to their respective work-piece sides.

Turning now to FIGS. 8 and 10, another embodiment of the present invention, relates to the first 105 and second 106 vacuum chambers. The vacuum levels in the respective vacuum chambers are managed according to a schedule of vacuum levels, namely, similar; different and different albeit wherein resultant forces created thereby is respectively negligible.

Referring to FIGS. 8, 9, 10 and 11, the present invention additionally relates to a work-piece deflection management system, using compensatory forces, and the system includes a work-piece 100, having a first-side 101, a body 102, and a second-side 103. On the first-side is a closed contiguous region capable of interfacing with an air-bearing seal 104. On the second-side is a closed contiguous region capable of interfacing with an air-bearing seal. Near and between these respective regions, the body of the work-piece has rigid structural integrity. The system also includes a first vacuum chamber 105 having an air-bearing seal circumscribing one of its sides. The first vacuum chamber air-bearing seal is positioned on the first-side closed contiguous region of the work-piece, allowing the work-piece to be laterally slid with respect to the first vacuum chamber. Furthermore, a second vacuum chamber 106 has an air-bearing seal circumscribing one of its sides. The second vacuum chamber air-bearing seal is positioned on the second-side closed contiguous region of the work-piece, allowing the work-piece to be laterally slid with respect to the second vacuum chamber. Other inclusions to the system are alignment means for maintaining the first vacuum chamber in substantially alignment with the second vacuum chamber. The first vacuum chamber is connected to the second vacuum chamber through an opening 901, 1001 and 1101 in the work-piece 102 and wherein the alignment means are restricted to maintain the opening between the two circumscribings, albeit the opening is in the work-piece rather than in the two vacuum chambers.

According to another embodiment of the present invention, this relates to a first vacuum chamber and a second vacuum chamber, each having air-bearing seals. The respective air-bearing seals are selected to include one or more parameters regarding air-bearing seals, specifically, the seals are similar to each other; the circumscribings are circular and the circumscribings are oriented parallel to their respective work-piece sides.

According to a further embodiment of the present invention, this relates to a first and a second vacuum chamber. The vacuum levels in the respective vacuum chambers are managed according to similar vacuum levels, different respective vacuum levels, different vacuums levels albeit wherein resultant forces created thereby are respectively negligible.

Figure 11:
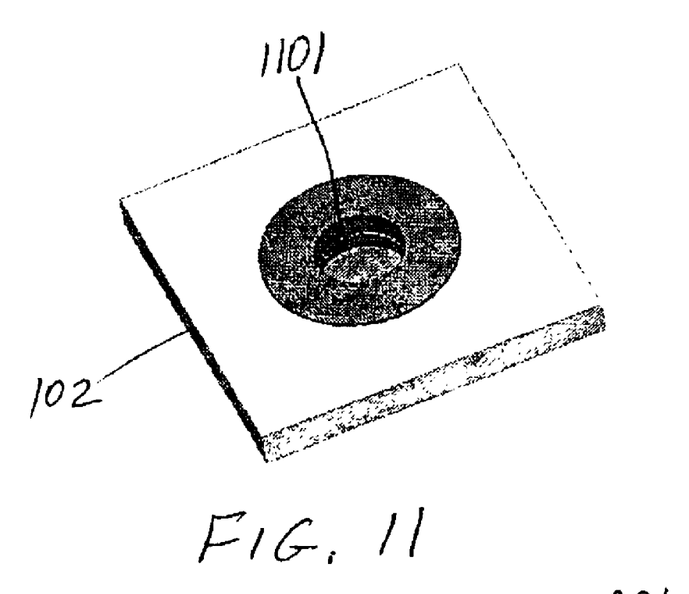
FIG. 11 illustrates an isometric schematic view of a work-surface having an opening to balance the vacuum between the upper and lower vacuum chambers.

According to one other embodiment of the present invention, this embodiment relates to the first vacuum chamber being connected to the second vacuum chamber through an opening. Turning now to FIGS. 9, 10 and 11, the opening 901, 1001 and 1101 is large enough to allow transfer of an article, of a portion of the vacuum level or for maintaining equal vacuum levels between the two vacuum chambers.

It will be appreciated by persons skilled in the art that the present invention is not to be limited by the drawings and description hereinabove presented. The present invention has been described with a certain degree of particularity, however those versed in the art will readily appreciate that various modifications and alterations may be carried out without departing from either the spirit or scope. Specifically, the invention is defined in accordance with the claims that follow.

What is claimed is:

1. A work-piece deflection management system, comprising: a first and a second vacuum chamber, each said vacuum chamber including an air-bearing seal circumscribing its side parallel to a side of, a work-piece plate; wherein the air-bearing seals are aligned to face one-another with the work-piece plate respectively there-between, allowing the work-piece plate to have an unrestricted lateral slide in all directions with respect to the air-bearing seals while maintaining a first predefined vacuum level within the first vacuum chamber and maintaining a second predefined vacuum level within the second vacuum chamber.

2. The work-piece deflection management system according to claim 1 wherein the work-piece plate includes at least one holder for rigidly griping said work-piece plate; thereby allowing precise lateral positioning of the work-piece plate.

3. The work-piece deflection management system according to claim 1 wherein the work-piece plate includes at least two holders for holding the work-piece plate respectively from at least two edges of said work-piece plate, to thereby reduce vibration in the work-piece plate.

4. The work-piece of claim 2 or 3 wherein at least one holder is located outside the first and second vacuum chambers.

5. The work-piece deflection management system according to claim 1 wherein each of the first vacuum chamber and the second vacuum chamber has an exterior that is substantially parallel to each other.

6. The work-piece deflection management system according to claim 1 wherein vacuum levels in the first and second vacuum chambers are similar.

7. The work-piece deflection management system according to claim 1 wherein vacuum levels in the first and second vacuum chambers differ from each other.

8. The work-piece deflection management system according to claim 1 wherein vacuum levels in the first and second vacuum chambers differ from each other whereas resultant forces created thereby are respectively negligible.

9. The work-piece deflection management system according to claim 1 wherein the work-piece plate includes an opening configured to allow material to move from one of the first or second vacuum chambers to the other.

10. The work-piece deflection management system according claim 1 wherein the work-piece plate includes at least one thin material body section located between the first and second vacuum chambers, wherein any one of the thin material body sections are located so as to not contact the air-bearing seals.

11. The work-piece deflection management system according to claim 10 wherein the thin material body section is transparent in a predetermined frequency to image and inspect there through.

12. A work-piece deflection management system, comprising:
a) a work-piece, including a first-side, a body, and a second-side, wherein
    i) the first-side includes a closed contiguous region configured to interface with a first air-bearing seal,
    ii) the second-side includes a closed contiguous region configured to interface with a second air-bearing seal, and
    iii) the body of the work-piece configured to have rigid structural integrity is located between the first side and the second side;
b) a first vacuum chamber, includes the first air-bearing seal circumscribing its side positioned on the first-side closed contiguous region of the work-piece, allowing the work-piece to have an unrestricted lateral slide in all directions with respect to the first vacuum chamber; and
c) a second vacuum chamber includes the second air-bearing seal circumscribing its side positioned on the second-side closed contiguous region of the work-piece, allowing the work-piece to have an unrestricted lateral slide in all directions with respect to the second vacuum chamber.

13. A work-piece deflection management system, comprising:
a) a work-piece configured to be rigid and planar is polished on both its upper side and its lower side, wherein the sides are parallel to each other and the work-piece is configured in a predetermined spatial orientation;
b) a first vacuum chamber oriented with respect to the work-piece, includes a first air-bearing seal circumscribing its lower side, the first air-bearing seal is positioned on the upper side of the work-piece allowing the work-piece to have an unrestricted lateral slide in all directions with respect to the first vacuum chamber; and
c) a second vacuum chamber oriented with respect to the work-piece, includes a second air-bearing seal circumscribing its upper side, and the second air-bearing seal is positioned on the lower side of the work-piece allowing the work-piece to have an unrestricted lateral slide in all directions with respect to the second vacuum chamber.

14. The work-piece deflection management system according to claim 13 wherein the work-piece is substantially horizontally configured such that one side therefore faces upward and another side thereof faces downward.

15. The work-piece deflection management system according to claim 13 wherein the polished upper and lower sides are substantially vertically configured such that one of the polished sides faces forward and another of the polished sides faces backward.

16. A work-piece deflection management system, comprising:
a) a work-piece, having a first-side, a body, and a second-side, wherein
    i) the first-side includes a closed contiguous region configured to interface with a first air-bearing seal,
    ii) the second-side includes a closed contiguous region configured to interface with a second air-bearing seal, and
    iii) the body of the work-piece configured to have rigid structural integrity is located between the first side and the second side;
b) a first vacuum chamber, wherein the first air-bearing seal circumscribes one of its sides, and the first air-bearing seal positioned on the first-side closed contiguous region of the work-piece, allowing the work-piece to have an unrestricted lateral slide in all directions with respect to the first vacuum chamber; and
c) a second vacuum chamber, wherein the second air-bearing seal circumscribes one of its sides and the first and second air-bearing seals have substantially identical shape and size, and the second air-bearing seal is positioned on the second-side closed contiguous region of the work-piece, allowing the work-piece to have an unrestricted lateral slide in all directions with respect to the second vacuum chamber.

17. The work-piece deflection management system according to claim 16 wherein the first and second air-bearing seals are configured to have similar shape and size, circular circumscribings, and parallel circumscribings to their respective work-piece sides.

18. The work-piece deflection management system according to claim 16 wherein vacuum levels in the first and second vacuum chambers are managed according to one of similar vacuum levels, different respective vacuum levels, and different vacuums levels wherein resultant forces created thereby are respectively negligible.

19. The work-piece deflection management system according to claim 16 wherein the first vacuum chamber is connected to the second vacuum chamber through an opening configured to allow fluid transfer between the first and the second vacuum chambers.

20. The work-piece deflection management system according to claim 16 wherein a vacuum level of the first chamber is different than a vacuum level in the second chamber.

21. The work-piece deflection management system according to claim 16 wherein the first-side of the work-piece is planar and the second-side of the work-piece is planar.

22. The work-piece deflection management system according to claim 16 wherein the first-side of the work-piece is parallel to the second-side of the work-piece.

23. The work-piece deflection management system according to claim 16 wherein at least one of the first side and second side of the work-piece has a curved configuration to interface with its corresponding air-bearing seal.

24. The work-piece deflection management system according to claim 23 wherein the curved configuration is concave.

25. The work-piece deflection management system according to claim 23 wherein the curved configuration is convex.

26. The work-piece deflection management system according claim 16 further comprising a work-piece plate that includes at least one thin material body section located between the first and second vacuum chambers, wherein any one of the thin material body sections are located so as to not contact the air-bearing seals.

27. The work-piece deflection management system according to claim 26 wherein the thin material body section is transparent in a predetermined frequency to image and inspect there through.

28. A work-piece deflection management system, comprising: (a) two vacuum chambers, each said chamber configured to have a first interface circumscribing one of its sides, and (b) a work-piece plate having a second interface circumscribing two of its sides; wherein the first interface of the first vacuum chamber is aligned to face the first interface of the second vacuum chamber with the work-piece plate and corresponding second interface respectively therebetween, configured such that the work-piece plate laterally slides with respect to each vacuum chamber; and an air-bearing seal configured to reside between the first interface of each vacuum chamber and respective second interfaces of the work-piece plate wherein a portion of the first and second interface circumscribings describe a cross section, and the work-piece side adjacent thereto has a corresponding contour shaped to fit into the cross section that includes the air-bearing seal, such that the motion of the work-piece is restricted by fitting together of the cross section with the contour.

29. The work-piece deflection management system according to claim 28 wherein the portions of the first and second circumscribings are straight.

30. The work-piece deflection management system according to claim 28 wherein the portions of the first and second circumscribings are a curved.

31. The work-piece deflection management system according to claim 28 wherein the first and second air-bearing seals have substantially the same profile.

32. The work-piece deflection management system according to claim 28 wherein the first and second air-bearing seals have substantially the same average radius from their respective normal axes.

33. The work-piece deflection management system according to claim 28 wherein each of the vacuum chambers are configured to move laterally with respect to each other.

34. The work-piece deflection management system according to claim 28 wherein the first and second air-bearing seals are at least one of being similar to each other, having circular circumscribings, and having circumscribings oriented parallel to their respective work-piece sides.

35. The work-piece deflection management system according to claim 28 wherein vacuum levels in the first and second vacuum chambers are managed according to one of similar vacuum levels, different respective vacuum levels, and different vacuums levels, wherein resultant forces created thereby are respectively negligible.

36. The work-piece deflection management system according claim 28 wherein the work-piece plate includes at least one thin material body section located between the first and second vacuum chambers, wherein any one of the thin material body sections are located so as to not contact the air-bearing seals.

37. The work-piece deflection management system according to claim 36 wherein the thin material body section is transparent in a predetermined frequency to image and inspect there through.

* * * * *